(12) United States Patent
Choi et al.

(10) Patent No.: US 7,746,129 B2
(45) Date of Patent: Jun. 29, 2010

(54) ULTRA LOW POWER SERVO-CONTROLLED SINGLE CLOCK RAMP GENERATOR WITH AMPLITUDE INDEPENDENT TO CLOCK FREQUENCY

(75) Inventors: Jung Hyun Choi, Sao Paulo (BR); Fernando Chavez Porras, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 97 days.

(21) Appl. No.: 12/098,113

(22) Filed: Apr. 4, 2008

(65) Prior Publication Data
US 2009/0251178 A1    Oct. 8, 2009

(51) Int. Cl.
*H03K 4/06*    (2006.01)
(52) U.S. Cl. .................. 327/131; 327/132; 327/133; 327/134; 327/135; 327/136; 327/137; 327/138; 327/139; 327/140
(58) Field of Classification Search .................. 327/131, 327/140
See application file for complete search history.

(56) References Cited

U.S. PATENT DOCUMENTS

| | | | |
|---|---|---|---|
| 4,225,825 A | 9/1980 | Watts | |
| 5,283,515 A | 2/1994 | Jordan | |
| 5,502,410 A * | 3/1996 | Dunn et al. | 327/140 |
| 6,169,433 B1 * | 1/2001 | Farrenkopf | 327/131 |

OTHER PUBLICATIONS

B. Provost et al., Auto-Calibrating Analog Timer for On-Chip Testing, ITC International Test Conference, 1999.
F. Azais et al., A Low-Cost Adaptive Ramp Generator for Analog BIST Applications, 19th IEEE Proceedings on VSLI Test Symposium, 2001.

* cited by examiner

*Primary Examiner*—Lincoln Donovan
*Assistant Examiner*—John W Poos
(74) *Attorney, Agent, or Firm*—Hamilton & Terrile, LLP; Michael Rocco Cannatti (57) ABSTRACT

A low power servo-controlled single clock ramp generator (100) includes a fast switched comparator (102), charge pump (110) and voltage-to-current converter (120) connected to provide a feedback control mechanism under control of a pulse comparison clock signal (pulse_comp) and a reset pulse clock signal (rst_pulse) that are generated from a single input clock signal (clkin) so that there are well defined time intervals between pulses in the pulse comparison clock signal and the reset pulse clock signal, thereby providing a ramp signal (Vramp_out) having a stable, frequency-independent amplitude that is not limited by the reference voltage.

20 Claims, 5 Drawing Sheets

ULTRA LOW POWER SERVO-CONTROLLED SINGLE CLOCK RAMP GENERATOR WITH AMPLITUDE INDEPENDENT TO CLOCK FREQUENCY

BACKGROUND OF THE INVENTION

1. Field of the Invention

The present invention relates generally to the field of ramp signal generators. In one aspect, the present invention relates to a circuit and method for generating ramped voltage signals having stable maximum amplitude.

2. Description of the Related Art

Ramp generator circuits are used to generate ramped voltages for various applications, such as pulse width modulated converters, DC-DC converters, built-in self test (BIST) circuits, sawtooth generators, etc. However, convention servo-controlled voltage ramp generators are unduly complex in terms of the circuit design and operation, thereby using valuable silicon area and consuming excessive power. For example, conventional ramp generators require that multiple clock phases be provided to the ramp generator, and/or that the provided clock frequencies are higher than the ramp signal frequency. In addition, conventional solutions require accurate pulse widths for use in monitoring and correcting the ramp signal, and also require that the ramp monitoring and correction steps be performed at same time (which can impair linearity). Another problem with conventional ramp generators is that the amplitude of the ramp signal depends on the input clock frequency, and therefore can vary variation as the input frequency changes. Yet another drawback with prior ramp generators is that the maximum or peak voltage of the ramp signal is constrained by the input reference voltage. These design and performance limitations not only result in large and inefficient designs, but also impose additional system costs where, for example, a high to medium precision digital-to-analog converter must be used.

Figure 1:
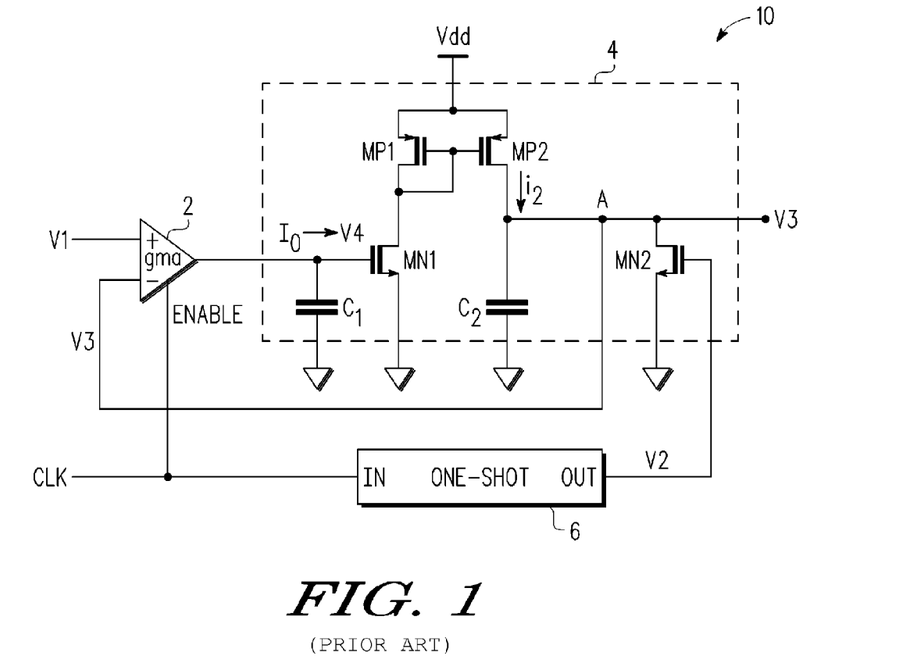
FIG. 1 depicts an example of a conventional ramped voltage generator.
Figure 2:
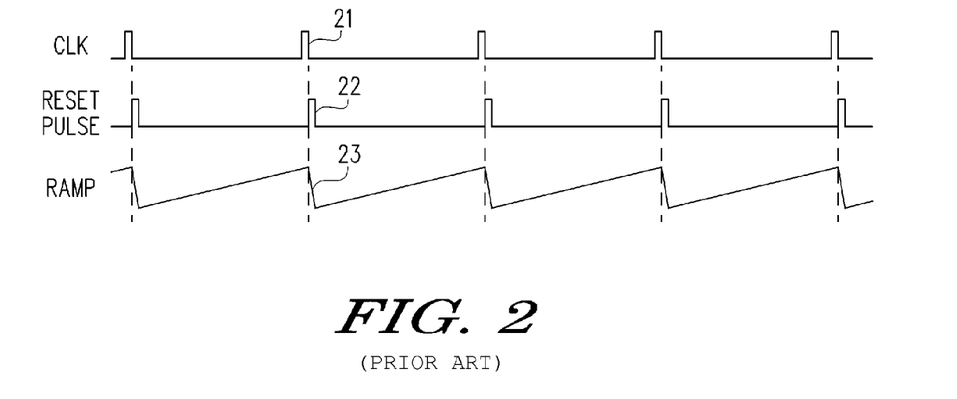
FIG. 2 is a signal timing diagram showing waveforms during operation of the ramped voltage generator of FIG. 1.

To provide an example of a conventional ramp generator circuit, reference is now made to FIG. 1 which depicts a ramped voltage generator 10 described in U.S. Pat. No. 6,169,433 to Farrenkopf wherein an operational transconductance amplifier 2 receiving a reference voltage is enabled by an input clock signal to drive a ramped voltage generation circuit 4 that produces a ramped voltage signal V3 that is fed back to the amplifier 2. The ramped voltage signal V3 is corrected or reset by the one-shot circuit 6 which receives, wherein input clock that enables the amplifier 2 also drives a one-shot circuit 6 which produces, in response to the input clock signal, a delayed voltage pulse train which is applied to discharge a capacitor C2 in the ramped voltage generation circuit 4 that is periodically charged and discharged to generate the ramped voltage V3. As shown in FIG. 2, the ramped voltage generator 10 receives the input clock signal 21 and generates therefrom the reset pulse signal 22 (which corresponds to the output V2 of the one-shot circuit 6). In response to the input clock signal 21, the ramped voltage generation circuit 4 produces the ramp signal 23 (which corresponds to the ramped voltage signal V3). While the input clock signal 21 is "high," the ramped voltage signal V3 is sampled, and when the reset pulse signal 22 is "high," the capacitor C2 is reset.

As this example shows, the sampling (monitoring) and reset (correction) events occur at same time, which can cause ramp distortion and decrease linearity, depending on the ramp period and clock pulse width. Given the temporal proximity of the clocking signals, the conventional ramped voltage generators require well synchronized and very accurate multi-phase pulse widths in order to monitor/adjust the ramp amplitude. Accordingly, there is a need for an improved voltage ramp generator circuit and methodology to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

A single clock ramp generator circuit and methodology are described for efficiently developing an accurate ramp voltage signal with high linearity and minimum amplitude variations over a large operating frequency range. In selected embodiments, the disclosed ramp generator circuit includes a fast switched comparator for comparing a reference voltage input to the ramp voltage signal output of the ramp generator circuit under control of a pulse comparison clock signal. The fully differential comparator outputs drive a ramp generator logic module and charge pump circuit to alternately charge an internal charging capacitor. In turn, the charge pump circuit drives a voltage-to-current converter circuit to charge an output capacitor which is periodically discharged under control of a reset pulse clock signal to generate the ramp voltage signal output. In effect, the charge pump and a voltage-to-current converter provide a feedback control mechanism to correct and stabilize the ramp voltage signal output over process, temperature and power supply variations. As described herein, the pulse comparison clock signal is used by the fast switched comparator to read or monitor the ramp voltage signal output, while the reset pulse clock signal is used to reset or correct the ramp voltage signal output. By deriving both the pulse comparison clock signal and the reset pulse clock signal from a single input clock signal so that the reading and correction intervals fall on the falling and rising clock edges, respectively, well defined and spaced time intervals are achieved, thereby eliminating the requirement of closely synchronized and accurate multi-phase pulses widths.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art. Various illustrative embodiments of the present invention will now be described in detail below with reference to the figures.

Figure 3:
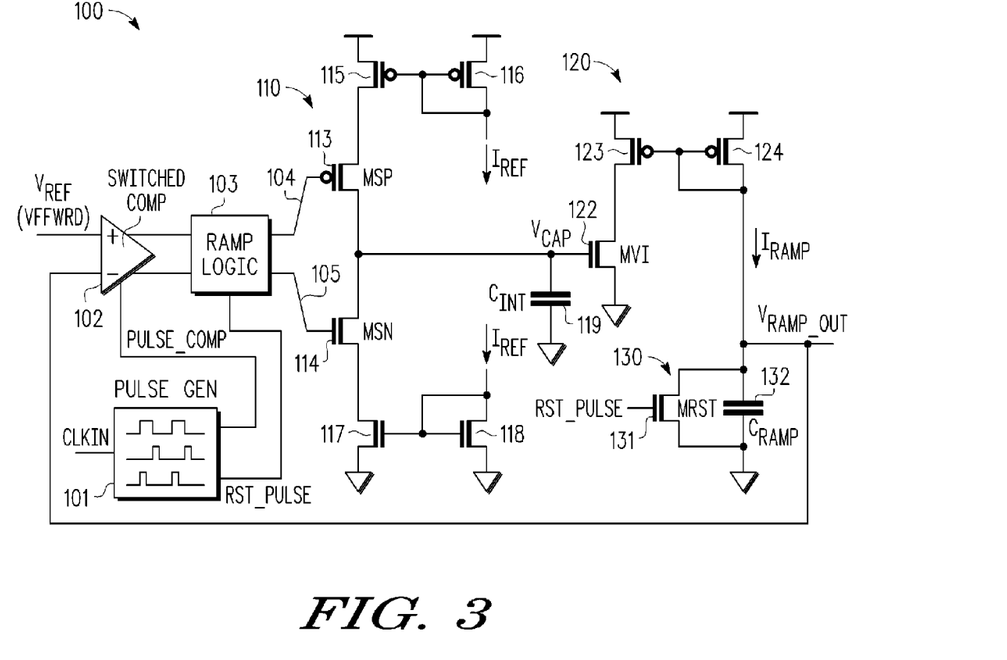
FIG. 3 is a circuit schematic representation of a single clock ramp generator circuit in accordance with selected embodiments of the present invention.

FIG. 3 is a circuit schematic representation of a single clock ramp generator circuit 100 in accordance with selected embodiments of the present invention. In the depicted example, the ramp generator circuit 100 includes a fast switched comparator 102, charge pump 110 that is driven by the output of the fast switched comparator 102, and a voltage-to-current converter 120 that is driven by the charge pump 110. With the charge pump 110 and voltage-to-current converter 120, a feedback loop is provided to the fast switched comparator 102 to generate a signal correction to the ramp every clock cycle of the input clock signal. As will be appreciated, this approach can be extended to be used in a DC-DC converter with feedforward, simply replacing Vref by a feedforward signal Vffwrd.

Using a single input clock (clkin), the ramp generator circuit 100 generates monitoring and correction clocks that are separated with well-defined and spaced time intervals, thereby eliminating the need to generate accurate pulse widths. To this end, a pulse generator circuit 101 is provided that generates a ramp monitoring clock signal (pulse_comp) that is generated on the falling edge of the input clock signal, and a correction clock signal (rst_pulse) that is generated on the rising edge of the input clock signal. While any desired clocking circuit may be used to implement the pulse generator circuit 101, in a example embodiment, the pulse generator circuit 101 uses first and second pulse subcircuits (not shown), each of which includes an input node coupled to a first input of an AND gate and to an inverter input, where the inverter output is coupled to the second input of the AND gate. The first pulse subcircuit receives the input clock signal and generates therefrom a short pulse (rst_pulse) at each rising edge of the input clock signal, while the second pulse subcircuit receives an inverted version of the input clock signal and generates therefrom a short pulse (pulse_comp) at each rising edge of the inverted input clock signal (which corresponds to the falling edge of the input clock signal). In the signal timing diagram of FIG. 4, the single input clock (clkin) 41 is shown along with the derived monitoring clock signal (pulse_comp) 43 and the correction clock signal (rst_pulse) 42.

While a pulse generator circuit 101 may be included as part of the ramp generator circuit 100 as shown in FIG. 3, in other embodiments, the pulse phases of the monitoring clock signal (pulse_comp) 43 and the correction clock signal (rst_pulse) 42 can be can be generated externally from the ramp generator circuit 100. With these other embodiments, a processor can generate monitoring clock signal (pulse_comp) 43 and the correction clock signal (rst_pulse) 42 so as to dynamically control the amplitude and frequency of the ramp voltage signal. For example, by generating monitoring and correction clock signals with a higher frequency, the frequency of the ramp voltage signal will likewise increase. Alternatively, by changing the timing of the pulses in the monitoring and correction clock signals, the amplitude of the ramp voltage signal will be changed.

Under control of the separately defined monitoring clock signal (pulse_comp) and correction clock signal (rst_pulse), the fast switched comparator 102, charge pump 110 and voltage-to-current converter 120 generate a ramp voltage signal output (Vramp_out) by charging an output capacitor Cramp which is periodically discharged under control of a reset correction signal (rst_pulse). In particular, the monitoring clock signal (pulse_comp) is used as a clock input to control the fast switched comparator 102 for comparing a reference voltage input (Vref) at the non-inverting input to the ramp voltage signal output (Vramp_out) at the inverting input. The outputs of the fast switched comparator 102 are processed by the ramp logic module 103 to generate charge and discharge signals 104, 105 to activate the PMOS transistor 113 or NMOS transistor 114 only when clocked or enabled by the correction clock signal (rst_pulse). In particular, the charge and discharge signals 104, 105 are controlled by the ramp logic module 103 to turn OFF the PMOS transistor 113 and NMOS transistor 114 when the correction clock signal (rst_pulse) is low, but the charge and discharge signals 104, 105 charge up the internal capacitor 119 of the charge pump 110 when the correction clock signal (rst_pulse) is high. For example, when the charge signal 104 is "low," the voltage Vcap at internal capacitor 119 is charged through the PMOS transistor 113 which is coupled to a first reference voltage (e.g., Vdd) via a current mirror configuration of PMOS transistors 115, 116. In similar fashion, when the discharge signal 105 is "high," the voltage Vcap at internal capacitor 119 is charged through the NMOS transistor 114 which is coupled to a second reference voltage (e.g., ground) via a current mirror configuration of NMOS transistors 117, 118. In this way, the ramp logic module 103 uses the charge and discharge signals 104, 105 to control the voltage Vcap at the internal capacitor 119.

As disclosed herein, the ramp logic module 103 and charge pump 110 are used to control the voltage Vcap at the internal capacitor 119 and thereby optimize power consumption. However, in other embodiments, the voltage Vcap may instead be controlled by replacing the ramp logic module 103 and charge pump 110 with a pair of switches that are directly connected, respectively, to the power supply and ground. The switch pair (not shown) may be gated to charge and discharge the internal capacitor 119.

The voltage Vcap developed at the internal capacitor 119 is converted to the ramp current Iramp by the voltage-to-current converter 120. In an example implementation, the voltage-to-current converter 120 includes a first NMOS transistor 122 which is gated by the voltage Vcap developed at the internal capacitor 119 to drive a current mirror configuration of PMOS transistors 123, 124, thereby generating a ramp current Iramp. With this configuration, the PMOS current mirror 123, 124 is employed to generate current for ramping up the ramp signal from ground to a specific Vpeak value. However, the PMOS current mirror 123, 124 is not required for ramping down the ramp signal. In this way, when the charge pump voltage Vcap is low, the ramp current Iramp is low, and when the charge pump voltage Vcap is high, the ramp current Iramp is high.

The ramp current Iramp is applied to the charging capacitor Cramp 132 to develop the ramp voltage signal output (Vramp_out) so that its voltage increases over the course of a ramp signal cycle. At the rising edge of the input clock signal (clkin), the ramp output voltage Vramp_out is reset by the reset NMOS transistor 131 which is connected to ground across the charging capacitor Cramp 132 and gated by the correction clock signal (rst_pulse). However, after correction, the ramp current Iramp charges the capacitor Cramp 132 so that the ramp voltage (Vramp_out) increases linearly until it is reset with the next pulse from the correction clock signal (rst_pulse).

Figure 4:
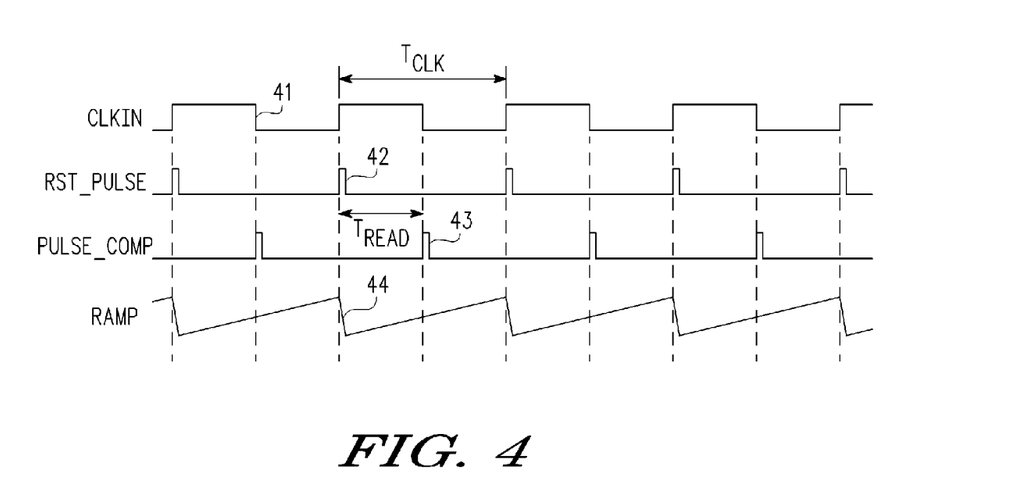
FIG. 4 is a signal timing diagram showing waveforms during operation of the single clock ramp generator circuit of FIG. 3.

While conventional ramp generators monitor and correct the ramp signal at substantially the same time (thereby causing ramp distortion and reduced linearity), the disclosed single clock ramp generator circuit 100 actuates the monitoring and correction operations at different times using the separately defined monitoring clock signal (pulse_comp) and correction clock signal (rst_pulse), as shown by the plot of the ramp voltage signal output 44 in FIG. 4. With the correction clock signal (rst_pulse) 42, the ramp signal is corrected or reset (ramp zeroing) during the reset time defined by the "high" pulse widths in the correction clock signal (rst_pulse) 42 so as not to affect the ramping up of the ramp voltage signal output 44. Since the ramp voltage signal $V_{ramp}$ at any particular read time $t_{read}$ is proportional to time—as shown by the equation $V_{ramp}(t_{read})=V_{ref}\times(T_{clk}/t_{read})=\alpha V_{ref}$—the ramp signal can be monitored at any point during the ramping up of the ramp voltage signal output 44, and the correction required will be directly proportional to $\alpha$. The duration of the monitor time (which is defined by the pulse widths in the monitoring clock signal 43) can be as short as the delay of switched comparator 102 required to perform sample and comparison. However, to address the worst case scenario, the pulse generator circuit 101 should be configured to guarantee a minimum pulse time/width for the monitoring clock signal 43 to insure that the reading pulse is larger than comparator delay over all process, voltage and/or temperature conditions. This may be accomplished by choosing the appropriate size or design for the pulse subcircuit used to generate the monitoring clock signal 43. Likewise, to address the best case scenario, the pulse generator circuit 101 should be configured to guarantee a minimum pulse time/width for the correction clock signal (rst_pulse) 42 to allow for complete discharge of the charging capacitor Cramp 132, even when charged by the maximum charge pump voltage. Again, the duration of the correction clock signal pulses may be controlled by choosing the appropriate size or design for the pulse subcircuit used to generate the correction clock signal 42.

Referring again to FIG. 3, the depicted ramp generator circuit 100 requires only a single input clock signal (clkin) 41 which controls the frequency of the ramp voltage signal output and which is used by the pulse generator circuit 101 to separately define the monitor and correction times. In particular, a monitor time is defined with the monitoring clock signal pulses 43 on the falling edge of the input clock signal 41, while a correction time is defined with the correction clock signal pulses 42 on the rising edge of the input clock signal 41. With this signaling arrangement, the ratio of $T_{clk}/t_{read}=\alpha$ will be 2, meaning that the reference voltage Vref that is provided to the ramp generator circuit 100 can be scaled down by half. As this example demonstrates, the maximum or peak voltage of the ramp voltage signal output is not limited by reference voltage, and indeed may be adjusted by changing the relative timing of the pulses in the monitoring clock signal (pulse_comp) 43 and the correction clock signal (rst_pulse) 42.

Figure 5:
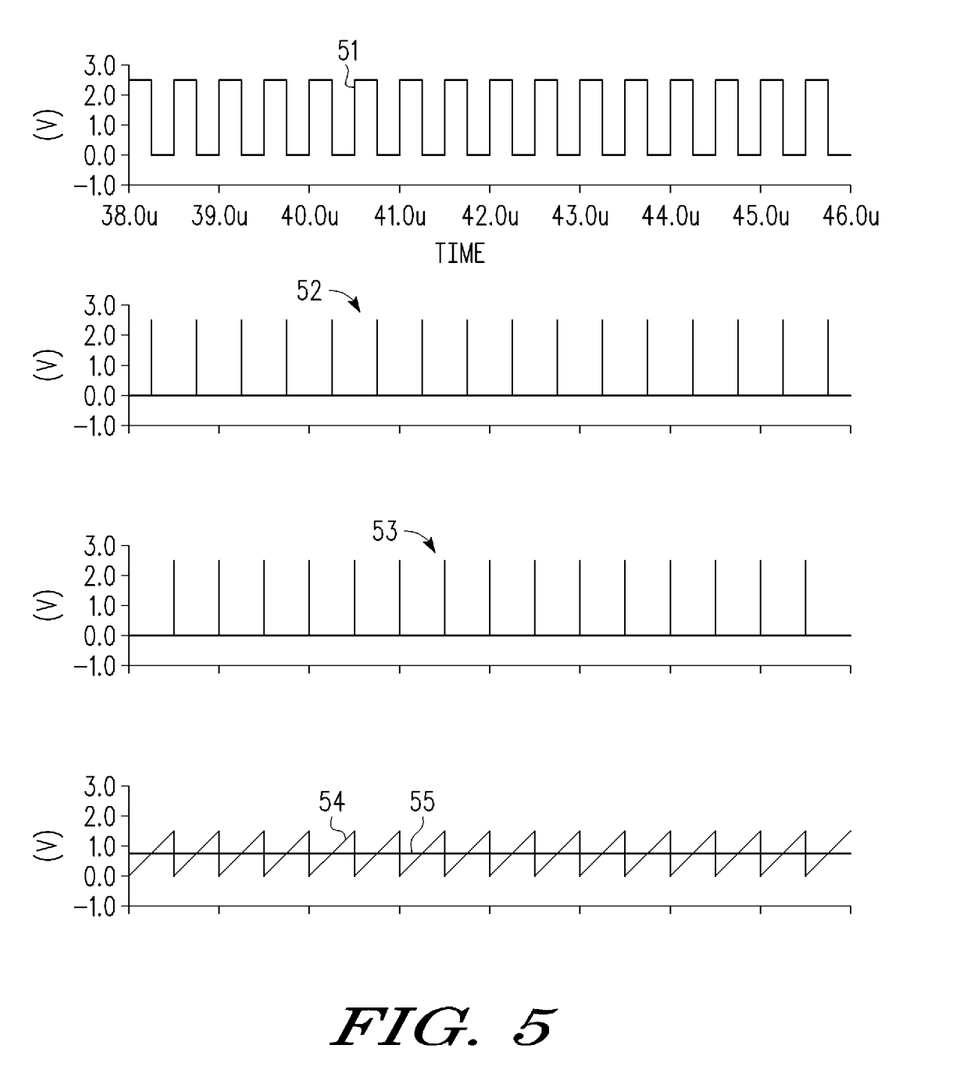
FIG. 5 depicts simulation result plots for a ramp signal and the related controlling signals generated by a single clock ramp generator circuit in accordance with selected embodiments of the present invention.

Referring to FIG. 5, simulation result plots are shown for a ramp signal 54 and the related controlling signals 51, 52 generated in response to a single input clock 51 by a ramp generator circuit in accordance with selected embodiments of the present invention. Based on the input clock signal 51, a ramp monitoring clock signal 52 is generated with a series of pulses that are created on the falling edges of the input clock signal 51. In addition, a correction clock signal 53 is generated with a series of pulses that are created on the rising edges of the input clock signal 51. The relative timing of the input clock signal 51, ramp monitoring clock signal 52, and correction clock signal 53 is seen more clearly in FIG. 6 which depicts an enlarged portion of the simulation result plots from FIG. 5. During each reset pulse 53, the ramp signal 54 is discharged to a predetermined minimum voltage (e.g., 0 volts), such as by using a clamping circuit (e.g., 131). At the same time, the ramp logic module is enabled to generate charge and discharge signals for driving the charge pump capacitor based on the previously generated output from the switched comparator.

Figure 6:
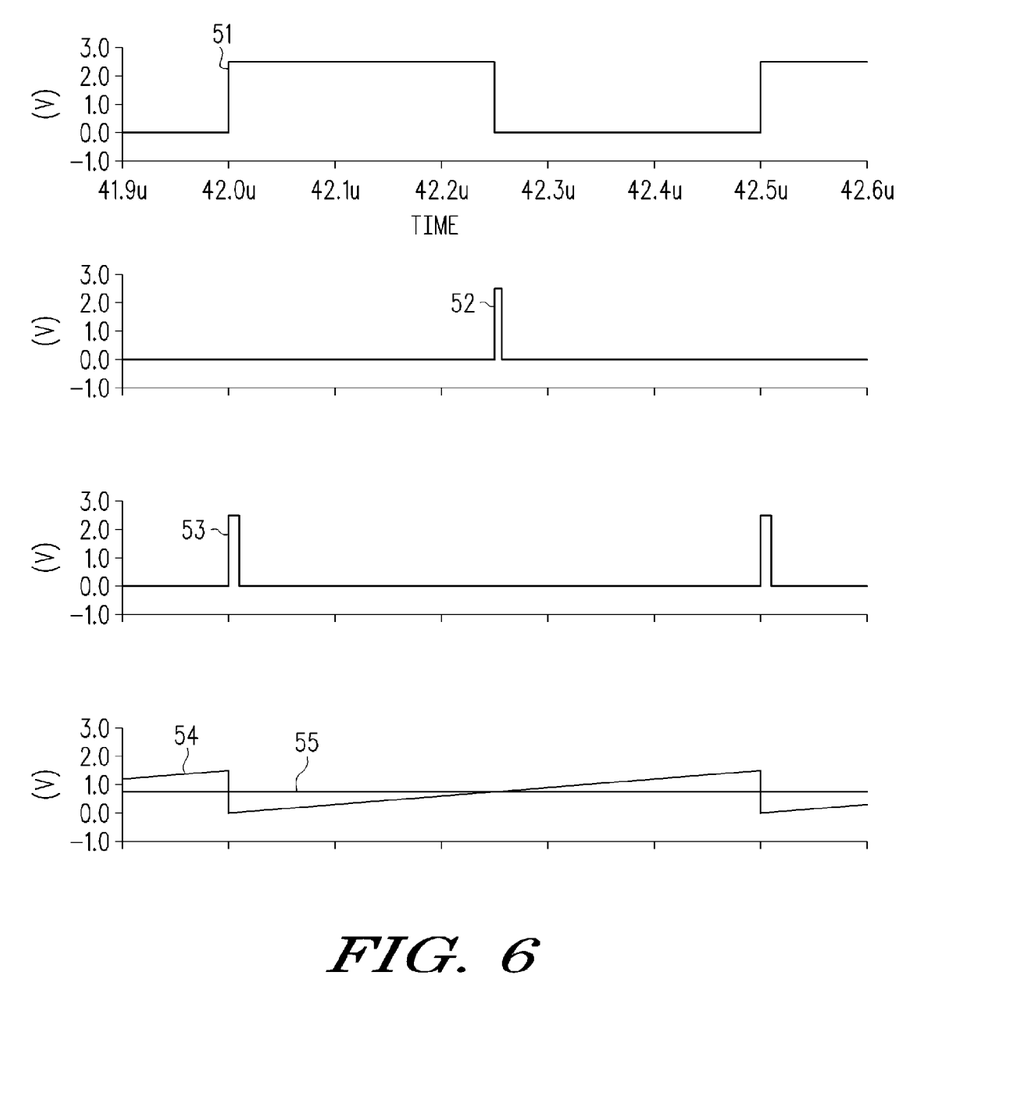
FIG. 6 depicts an enlarged portion of the simulation result plots from FIG. 5.

Once the pulse from the correction clock signal 53 disappears, the clamping circuit is rendered non-operative and the voltage across the ramp generator's output capacitor begins to increase, as indicated by the ramp up of the ramp signal 54. The voltage increase in the ramp signal 54 is caused by the ramp current Iramp as it charges the ramp generator's output capacitor, and the ramp current Iramp, in turn, is caused by the voltage Vcap at the charge pump capacitor. As indicated, the ramp signal 54 is able to exceed the reference voltage Vref 55 (e.g., 700 mV) by virtue of the charge pump portion of the ramp generator circuit which charges the charge pump capacitor to a voltage that drives the ramp current.

During each comparison pulse 52, the ramp signal 54—which is provided as a feedback correction signal—is compared to the reference voltage 55 at the switched comparator. The captured comparison result is provided to the ramp logic module for purposes of making any required corrections in the ramp signal 54 by controlling the charge pump at the next correction clock signal pulse 53. If the comparison by the switched capacitor indicates that the feedback ramp signal is higher than desired for expected operation (e.g., is higher than a predetermined voltage), the ramp logic module discharges the charge pump capacitor (e.g., by generating discharge signal 105). This operation reduces the voltage Vcap at the charge pump capacitor (and thereby the ramp current Iramp), and is repeated with each clock cycle to reduce the voltage Vcap at the charge pump capacitor until the comparison indicates that the feedback ramp signal is correct for expected operation. On the other hand, if the comparison by the switched capacitor indicates that the feedback ramp signal is lower than it should be (e.g., is lower than a predetermined voltage), then ramp logic module charges the charge pump capacitor (e.g., by generating charge signal 104) to increase the voltage Vcap at the charge pump capacitor, and thereby the ramp current Iramp. This operation is repeated with each clock cycle to increase the voltage Vcap at the charge pump capacitor until the comparison indicates that the feedback ramp signal is correct for expected operation.

Figure 7:
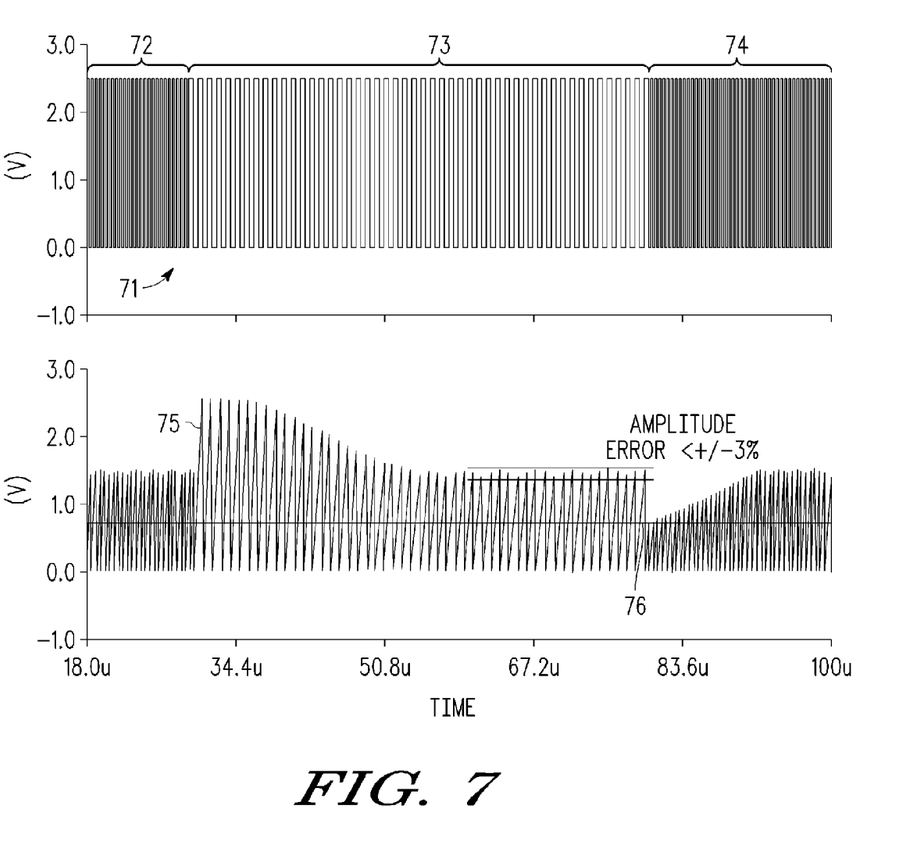
FIG. 7 depicts simulation result plots for a varying frequency input clock signal and the resulting ramp signal generated by a single clock ramp generator circuit in accordance with selected embodiments of the present invention.

As a result of the foregoing, the frequency of the input clock signal controls the frequency of the ramp voltage signal output, but the amplitude of the ramp voltage signal output generated by the ramp generator circuit is independent on the frequency of the input clock signal. This is demonstrated with FIG. 7 which depicts the simulation result plots for a varying frequency input clock signal 71 and the resulting ramp signal 75 generated by a single clock ramp generator circuit in accordance with selected embodiments of the present invention. Though not shown in FIG. 7, the input clock signal 71 is used to generate monitoring pulses at the falling edges of the input clock signal, and to generate ramp reset/correction pulses on the rising edges of the input clock signal. With this arrangement, the amplitude of the ramp voltage signal output converges to the desired amplitude, even as the frequency of the depicted input clock signal 71 changes. For example, FIG. 7 shows that the frequency of the input clock signal 71 changes dynamically from a first higher frequency portion 72 (e.g., 4 MHz) to a lower frequency portion 73 (e.g., 2 MHz) and back to a higher frequency portion 74 (e.g., 4 MHz). While the amplitude of the ramp signal 75 increases when the input clock frequency decreases (due to the longer charging time for the charge pump capacitor), the resulting ramp signal 75 generated by the ramp generator circuit quickly tracks back to the original amplitude (e.g., 1.4 volts). Conversely, the amplitude of the ramp signal 75 decreases when the input clock frequency increases (due to the shorter charging time for the charge pump capacitor), but the resulting ramp signal 75 quickly tracks back to the original amplitude (e.g., 1.4 volts). Thus, FIG. 7 confirms that the ramp signal amplitude is independent of the input clock frequency.

The various embodiments of the single clock ramp generator circuit disclosed herein provides a number of possible benefits. Since only a single input clock is used to control the frequency of the ramp signal, there is no need to employ multiple clock phases or high frequency clock signals. And by separating the ramp monitoring and reset operations, a servo-controlled ramp generator can be used without requiring accurate pulse widths or extra phase synchronization circuitry for generating synchronized pulse phases. In addition, the ramp signal has a stable, frequency-independent amplitude that is not limited by the reference voltage. The stability is shown in FIG. 7 where there is less than 3% error in the ramp signal amplitude over the steady-state cycles, though the error can be as low as the specification requires. Furthermore, servo-controlled ramp generator operates with ultra-low power, as shown with electrical simulations of the ramp generator using a power supply Vdd=2.5V and a reference voltage Vref=700 mV, in which case the total power consumption is around 6 uA at an input clock frequency of 2 MHz, and is around 10 uA at an input clock frequency of 4 MHz.

By now it should be appreciated that there has been provided a ramp generator method and circuit for generating a ramped voltage at an output node. A pulse generator circuit is included which generates a pulse comparison clock signal and a reset pulse clock signal from a single input clock signal so that there are well defined time intervals between pulses in the pulse comparison clock signal and the reset pulse clock signal. As described herein, the pulse generator circuit generates the pulse comparison clock signal by generating a pulse at each falling edge of the single input clock signal, and generates the reset pulse clock signal by generating a pulse at each rising edge of the single input clock signal. When the input clock has a fifty percent duty cycle, the result is that pulses generated for the pulse comparison clock signal in each cycle of the single input clock signal occur substantially midway through the charging of the charging capacitor by the ramp current. The ramp generator also includes a switched comparator circuit which has a first non-inverting input coupled to receive a reference signal, a second inverting input coupled to the output node to receive the ramped voltage, and a comparator output node, and which is configured to output a comparison signal in response to the pulse comparison clock signal, where the comparison signal indicates a difference between the ramped voltage and the reference signal. The switched comparator controls a charge pump circuit which has a charge pump capacitor that is charged or discharged only during pulses in the reset pulse clock signal to develop a control voltage in response to the comparison signal. The control of the charge pump may be exercised through a ramp control logic module which generates one or more control signals in response to the comparison signal for controlling the charge pump circuit. In selected embodiments, the charge pump includes first and second charging transistors for connecting the charge pump capacitor to first and second reference voltages, thereby charging and discharging the charge pump capacitor in response to first and second control signals, respectively. The charge pump circuit controls a voltage-to-current converter circuit which generates a ramp current in response to the control voltage. The ramp current is coupled to charge a charging capacitor so as to develop the ramped voltage at the output node. Finally, a clamping circuit is coupled across the charging capacitor for discharging the charging capacitor in response to the reset pulse clock signal. With the disclosed configuration, the control signals from the ramp control logic module control the charge pump circuit to adjust the control voltage so that the ramp current is correspondingly adjusted, thereby adjusting the ramped voltage to a predetermined maximum amplitude over a plurality of cycles in the single input clock signal.

In another form, there is provided a circuit, method and system for generating a ramped voltage having controlled maximum amplitude. As disclosed, a pulse comparison clock signal and a reset pulse clock signal are generated which have well defined time intervals between pulses in the pulse comparison clock signal and the reset pulse clock signal. The pulse comparison and reset pulse clock signals may be generated by generating pulses for the pulse comparison clock signal at each falling edge of a single input clock signal, and generating pulses for the reset pulse clock signal at each rising edge of the single input clock signal. The pulses from the pulse comparison and reset pulse clock signals are used to periodically charge and discharge a ramp capacitor to generate the ramped voltage. This is accomplished by monitoring the ramped voltage with a switched comparator which compares the ramped voltage at an inverting input with a reference voltage at a non-inverting input during each pulse in the comparison clock signal to develop a ramp correction signal that is captured during each pulse in the reset pulse clock signal. In addition to monitoring the ramped voltage, the ramped voltage is corrected with each pulse in the reset pulse clock signal by discharging the ramp capacitor during each pulse in the reset pulse clock signal and then charging the ramp capacitor with a ramp current that is generated in response to the ramp correction signal. As disclosed, the ramp capacitor may be charged by generating one or more control signals in response to the ramp correction signal during each pulse in the reset pulse clock signal, charging a charge pump capacitor to a control voltage in response to the one or more control signals, generating the ramp current in response to the control voltage, and then charging the ramp capacitor with the ramp current so as to develop the ramped voltage. To charge the charge pump capacitor, the charge pump capacitor may be charged to a first reference voltage in response to a first control signal, and may be discharged to a second reference voltage in response to a second control signal. In selected embodiments, the ramped voltage at the ramp capacitor is monitored substantially midway through the charging the ramp capacitor with the ramp current, and is discharged by connecting a clamping circuit across the ramp capacitor in response to each pulse in the reset pulse clock signal.

In yet another form, there is provided a circuit, method and system for generating a ramped voltage having a controlled maximum amplitude over a plurality of cycles in an input clock signal. As disclosed, a pulse comparison clock signal and a reset pulse clock signal are generated from a single input clock signal by a pulse generator so that pulses in the pulse comparison clock signal are substantially centered between pulses in the reset pulse clock signal. The pulse generator may be implemented as a first clocking sub-circuit for generating pulses for the pulse comparison clock signal at each falling edge of a single input clock signal, and a second clocking sub-circuit for generating pulses for the reset pulse clock signal at each rising edge of the single input clock signal. In addition, a switched comparator is provided having a first input coupled to receive a reference signal, a second input coupled to receive the ramped voltage in feedback, a comparator output node, and an enable node coupled to receive a pulse comparison clock signal, wherein the switched comparator is configured to produce a comparison signal which indicates a difference between the ramped voltage and the reference signal in response to being enabled by the pulse comparison clock signal. The switched comparator drives a correction circuit which generates a target control voltage at an internal charging capacitor in response to the comparison signal. In selected embodiments, the correction circuit includes a ramp logic module which receives the comparison signal and generates therefrom one or more control signals which indicate a difference between the ramped voltage and a target voltage in response to being enabled by a reset pulse clock signal. The correction circuit may also include a charge pump circuit for charging the internal charging capacitor to a target control voltage in response to the one or more control signals. In response to the target control voltage, a voltage-to-current converter circuit is coupled to generate a ramp current which is provided to a ramp capacitor. The ramp capacitor is periodically charged and discharged in a controlled fashion by receiving the ramp current so as to develop the ramped voltage having a controlled maximum amplitude at the output node over a plurality of cycles of the single input clock signal, where the ramp capacitor is discharged at each pulse of the reset pulse clock signal.

Although the described exemplary embodiments disclosed herein are directed to methods and systems for generating a stable ramp signal with an ultra low power servo-controlled single clock ramp generator, the present invention is not necessarily limited to the example embodiments illustrate herein, and various embodiments of a voltage regulator circuit and methodology disclosed herein may be implemented with other circuit components. For example, any pulse generation circuitry can be used to generate pulse comparison and reset pulse clock signals with well-defined and spaced time intervals and with established minimum pulse widths. In addition, the ramp generator logic module may be implemented with hardware and/of software with code that is executed by a processor or controller, with the code and any underlying or processed data being stored in any machine-readable or computer-readable storage medium, such as an on-board or external memory unit. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A ramp generator circuit for generating a ramped voltage at an output node, comprising:
    a pulse generator circuit for generating a pulse comparison clock signal and a reset pulse clock signal from a single input clock signal so that there are well defined time intervals between pulses in the pulse comparison clock signal and the reset pulse clock signal;
    a switched comparator circuit comprising a first input coupled to receive a reference signal, a second input coupled to the output node to receive the ramped voltage, and a comparator output node, wherein the switched comparator circuit is configured to produce, in response to the pulse comparison clock signal, a comparison signal at the comparator output node which indicates a difference between the ramped voltage and the reference signal;
    a charge pump circuit comprising a charge pump capacitor which is charged or discharged to develop a control voltage in response to the comparison signal;
    a voltage-to-current converter circuit for generating a ramp current in response to the control voltage;
    a charging capacitor which is coupled to receive the ramp current so as to develop the ramped voltage at the output node; and
    a clamping circuit coupled across the charging capacitor for discharging the charging capacitor in response to the reset pulse clock signal.

2. The ramp generator circuit of claim 1, where the pulse generator circuit generates the pulse comparison clock signal by generating a pulse at each falling edge of the single input clock signal, and generates the reset pulse clock signal by generating a pulse at each rising edge of the single input clock signal.

3. The ramp generator circuit of claim 1, where the single input clock signal has a fifty percent duty cycle.

4. The ramp generator circuit of claim 1, where the pulse generator circuit generates the pulse comparison clock signal by generating a pulse in each cycle of the single input clock signal to occur substantially midway through the charging of the charging capacitor by the ramp current.

5. The ramp generator circuit of claim 1, further comprising ramp control logic module for generating one or more control signals in response to the comparison signal, where the one or more control signals control the charge pump circuit.

6. The ramp generator circuit of claim 5, where the charge pump circuit comprises:
    a first charging transistor for connecting the charge pump capacitor to a first reference voltage in response to a first control signal; and
    a second discharging transistor for connecting the charge pump capacitor to a second reference voltage in response to a second control signal.

7. The ramp generator circuit of claim 5, where the one or more control signals control the charge pump circuit to adjust the control voltage so that the ramp current is correspondingly adjusted, thereby adjusting the ramped voltage to a predetermined maximum amplitude over a plurality of cycles in the single input clock signal.

8. The ramp generator circuit of claim 1, where the charge pump circuit charges or discharges the charge pump capacitor only during pulses in the reset pulse clock signal.

9. A method for generating a ramped voltage having controlled maximum amplitude, comprising:
    generating a pulse comparison clock signal and a reset pulse clock signal having well defined time intervals between pulses in the pulse comparison clock signal and the reset pulse clock signal; and
    periodically charging and discharging a ramp capacitor to generate the ramped voltage, comprising:
        monitoring the ramped voltage with a switched comparator by comparing the ramped voltage with a reference voltage during each pulse in the comparison clock signal to develop a ramp correction signal that is captured during each pulse in the reset pulse clock signal, and
        correcting the ramped voltage with each pulse in the reset pulse clock signal by discharging the ramp capacitor during each pulse in the reset pulse clock signal and then charging the ramp capacitor with a ramp current that is generated in response to the ramp correction signal.

10. The method of claim 9, where generating a pulse comparison clock signal and a reset pulse clock signal comprises:
    generating pulses for the pulse comparison clock signal at each falling edge of a single input clock signal, and
    generating pulses for the reset pulse clock signal at each rising edge of the single input clock signal.

11. The method of claim 9, where monitoring the ramped voltage with a switched comparator occurs substantially midway through the charging the ramp capacitor with the ramp current.

12. The method of claim 9, where discharging the ramp capacitor comprises connecting a clamping circuit across the ramp capacitor in response to each pulse in the reset pulse clock signal.

13. The method of claim 9, where charging the ramp capacitor with a ramp current that is generated in response to the ramp correction signal comprises:
    charging a charge pump capacitor to a control voltage in response to the ramp correction signal;
    generating the ramp current in response to the control voltage; and
    charging the ramp capacitor with the ramp current so as to develop the ramped voltage.

14. The method of claim 9, monitoring the ramped voltage with a switched comparator comprises feeding back the ramped voltage to an inverting input of the switched comparator for comparison with the reference voltage with is applied to a non-inverting input of the switched comparator.

15. The method of claim 9, where periodically charging and discharging the ramp capacitor to generate the ramped voltage further comprises generating one or more control signals in response to the ramp correction signal during each pulse in the reset pulse clock signal.

16. The method of claim 15, where charging the ramp capacitor with a ramp current that is generated in response to the ramp correction signal comprises:
    charging a charge pump capacitor to a control voltage in response to the one or more control signals;
    generating the ramp current in response to the control voltage; and
    charging the ramp capacitor with the ramp current so as to develop the ramped voltage.

17. The method of claim 15, where charging the charge pump capacitor to a control voltage in response to the one or more control signals comprises:
    charging the charge pump capacitor to a first reference voltage in response to a first control signal; and
    discharging the charge pump capacitor to a second reference voltage in response to a second control signal.

18. A circuit for generating a ramped voltage having a controlled maximum amplitude over a plurality of cycles in an input clock signal, comprising:
    a pulse generator for generating a pulse comparison clock signal and a reset pulse clock signal from a single input clock signal so that pulses in the pulse comparison clock signal are substantially centered between pulses in the reset pulse clock signal;
    a switched comparator having a first input coupled to receive a reference signal, a second input coupled to receive the ramped voltage in feedback, a comparator output node, and an enable node coupled to receive a pulse comparison clock signal, wherein the switched comparator is configured to produce a comparison signal which indicates a difference between the ramped voltage and the reference signal in response to being enabled by the pulse comparison clock signal;
    a correction circuit for generating a target control voltage at an internal charging capacitor in response to the comparison signal;
    a voltage-to-current converter circuit for generating a ramp current in response to the target control voltage;
    a ramp capacitor which is periodically charged and discharged in a controlled fashion by receiving the ramp current so as to develop the ramped voltage having a controlled maximum amplitude at the output node over a plurality of cycles of the single input clock signal, where the ramp capacitor is discharged at each pulse of the reset pulse clock signal.

19. The circuit of claim 18, where the correction circuit comprises:
    a ramp logic module coupled to receive the comparison signal from the comparator output node, wherein the ramp logic module is configured to generate one or more control signals which indicate a difference between the ramped voltage and a target voltage in response to being enabled by a reset pulse clock signal; and
    a charge pump circuit for charging the internal charging capacitor to a target control voltage in response to the one or more control signals.

20. The circuit of claim 18, where the pulse generator comprises:
    a first subcircuit for generating pulses for the pulse comparison clock signal at each falling edge of a single input clock signal, and
    a second subcircuit for generating pulses for the reset pulse clock signal at each rising edge of the single input clock signal.

* * * * *